(12) United States Patent
DiVerde

(10) Patent No.: US 11,926,424 B2
(45) Date of Patent: Mar. 12, 2024

(54) THERMOELECTRIC COOLING ASSEMBLY AND METHOD FOR THERMALLY INSULATING AN AIRCRAFT FUSELAGE EXTERIOR FROM AN AIRCRAFT ANTENNAE ARRAY

(71) Applicant: The Boeing Company, Chicago, IL (US)

(72) Inventor: Michael Bartolomeo DiVerde, Granite Falls, WA (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 17/552,981

(22) Filed: Dec. 16, 2021

(65) Prior Publication Data

US 2023/0192300 A1 Jun. 22, 2023

(51) Int. Cl.
*B64D 13/08* (2006.01)
*F25B 21/02* (2006.01)

(52) U.S. Cl.
CPC ............. *B64D 13/08* (2013.01); *F25B 21/02* (2013.01)

(58) Field of Classification Search
CPC ........ B64D 13/08; B64D 13/06; B64D 13/02; B64D 13/006; B64D 2013/0618; B64D 2013/0688; B64D 2013/0611; B64D 2013/064; B64D 2013/0644; B64D 2013/0655; B64D 2221/00; B64D 33/02; B64D 33/04; F25B 21/02; F02C 6/08
See application file for complete search history.

(56) References Cited

U.S. PATENT DOCUMENTS

| | | | |
|---|---|---|---|
| 5,921,087 A | 7/1999 | Bhatia et al. | |
| 8,973,377 B2* | 3/2015 | Hiller | B64D 41/00 62/3.61 |
| 10,249,884 B2* | 4/2019 | Yee | H01M 6/36 |
| 10,892,549 B1* | 1/2021 | Smith | H01Q 3/34 |
| 2012/0118345 A1* | 5/2012 | Stoia | F02C 6/18 136/205 |
| 2017/0062925 A1* | 3/2017 | Sanchez | H01Q 1/50 |
| 2020/0173698 A1* | 6/2020 | Ahmed | F25B 21/02 |
| 2020/0263915 A1 | 8/2020 | Ikemura et al. | |
| 2021/0242576 A1* | 8/2021 | Schaupmann | H01Q 1/286 |

FOREIGN PATENT DOCUMENTS

| | | |
|---|---|---|
| CN | 110401001 B | 2/2021 |
| EP | 3905432 A1 | 11/2021 |
| JP | 2013120899 A | 6/2013 |
| KR | 102132681 B1 | 7/2020 |

OTHER PUBLICATIONS

EP Search Report dated Apr. 18, 2023 in re EP Application No. 22213173.2.

* cited by examiner

*Primary Examiner* — Gordon A Jones
(74) *Attorney, Agent, or Firm* — COATS & BENNETT, PLLC

(57) ABSTRACT

Thermoelectric cooling assemblies, and systems and methods employing such assemblies integrated within an aircraft antennae radome, with the cooling assemblies operating exclusively via electrical power provided by scavenging waste heat from an adjoining antennae array provide thermal protection to heat-sensitive structural components adjoining the antennae array.

20 Claims, 7 Drawing Sheets

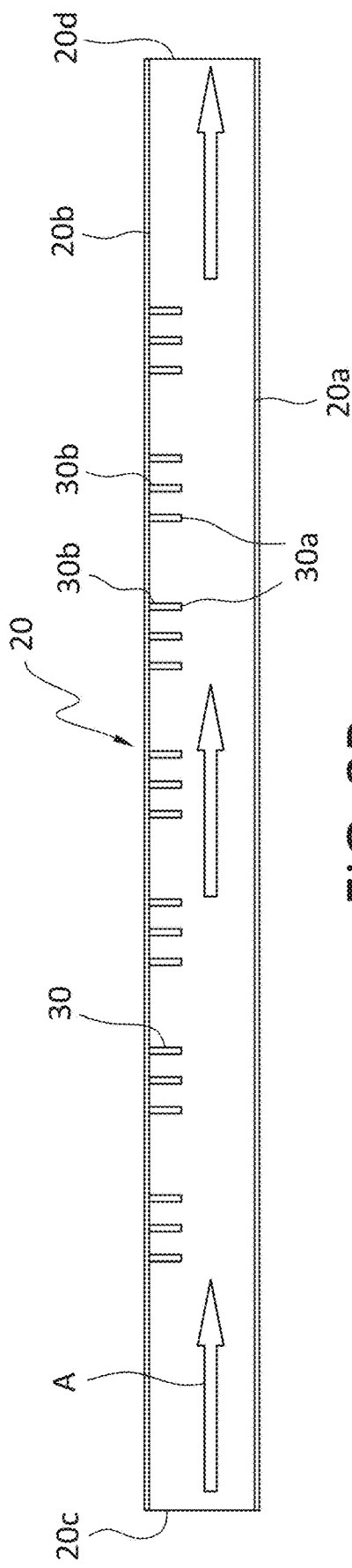
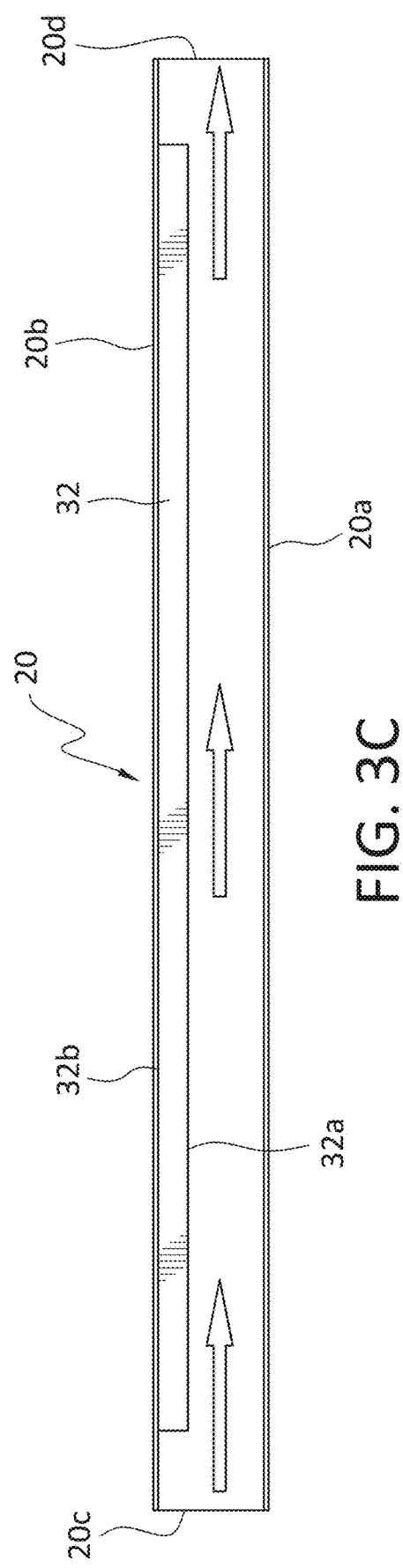
FIG. 3B
FIG. 3C

THERMOELECTRIC COOLING ASSEMBLY AND METHOD FOR THERMALLY INSULATING AN AIRCRAFT FUSELAGE EXTERIOR FROM AN AIRCRAFT ANTENNAE ARRAY

TECHNOLOGICAL FIELD

The present disclosure relates to the field of thermal insulators and thermal cooling assemblies. More specifically, the present disclosure relates to the field of preventing adverse impacts of heat on a structural component adjacent an aircraft antennae array.

BACKGROUND

As the use of phased array connectivity antennae arrays gain popularity for establishing or maintaining communication (e.g., internet communication, cell phone communication, etc.) with, for example, satellites, etc., operational complications have arisen as to the amounts of heat and high temperatures generated by such antennae arrays during use. As the antennae arrays can be mounted onto aircraft fuselage exteriors, concerns have arisen regarding the impact of excessive heat transfer from the antennae array to adjacent aircraft fuselage exteriors. Lightweight materials including, for example, composite materials and/or other structural materials alloys that can afford benefits in terms of material density and strength-to-weight ratios, may degrade or otherwise have their structural integrity compromised over time, if such materials are exposed to unwanted and excessive heat.

Unless explicitly identified as such, no statement herein is admitted as prior art merely by its inclusion in the Technological Field and/or Background section.

SUMMARY

According to a present aspect, a thermoelectric cooling assembly for an antennae array is disclosed, with the thermoelectric cooling assembly including a ceramic shield layer, with the ceramic shield layer including a ceramic shield layer first side and a ceramic shield layer second side. The thermoelectric cooling assembly further includes a thermoelectric generator, with the thermoelectric generator including a thermoelectric generator first side, and a thermoelectric generator second side. The thermoelectric cooling assembly further includes an air duct, with the air duct including an air duct first side, with the air duct first side located proximate to the ceramic shield layer second side, with the air duct further including an air duct second side, with the air duct second side located proximate to the thermoelectric generator first side. According to a present aspect, the air duct further includes an air duct inlet and an air duct outlet. The thermoelectric cooling assembly further includes at least one electrically-powered blower, with the electrically-powered blower oriented proximate to at least one of the air duct inlet and the air duct outlet, with the at least one electrically-powered blower configured to provide an airflow through the air duct, and with the at least one electrically-powered blower in communication with the thermoelectric generator.

In another aspect, the antennae array further comprises a radome, with the radome configured to house the antennae array, and the thermoelectric cooling assembly, with the radome comprising a radome inlet in communication with the air duct inlet, and with the radome further comprising a radome outlet in communication with the air duct outlet.

In another aspect, the antennae array is positioned proximate to the thermoelectric generator second side.

In a further aspect, the antennae array includes a phased array connectivity antennae array.

In another aspect, the antennae array further includes at least one supporting electronic unit.

In another aspect, the thermoelectric cooling assembly further includes an adapter plate, with the adapter plate configured to fixedly attach the antennae array assembly to an aircraft fuselage exterior, with the adapter plate comprising an adapter plate first side and an adapter plate second side, with the adapter plate first side located proximate to the aircraft fuselage exterior, and with the adapter plate second side positioned proximate to the ceramic shield layer first side. The terms "antennae array" and "antennae array assembly" are equivalent terms used interchangeably herein, with the caveat that an antennae array assembly can include electronic units that are integral with or integrated within the antennae array, or that are in communication with the antennae array but not necessarily integrated within the antenna array, but with such electronic units located within an antennae array radome, and where such electronic units can also emit an amount of heat.

In a further aspect, when the thermoelectric cooling assembly is in an operable state, the antennae array can reach an operating temperature ranging from about −65° F. to about 450° F.

In another aspect, when the thermoelectric cooling assembly is in an operable state, the ceramic shield first side does not exceed a temperature ranging from about −65° F. to about 180° F. when the antennae array reaches a temperature ranging from about −65° F. to about 450° F.

In a further aspect, the thermoelectric generator is configured to convert an amount of heat generated by the antennae array into an amount of electricity, with the amount of electricity adequate to exclusively power the at least one electrically-powered blower.

In another aspect, an object comprising the thermoelectric cooling assembly is disclosed.

In a further aspect, the object is an aircraft including the disclosed thermoelectric cooling assembly.

In a further aspect, the air duct first side is proximate to the ceramic shield layer second side, with the air duct further including an air duct second side, and with the air duct second side proximate to the thermoelectric generator first side.

In another aspect, the radome is further configured to attach to an aircraft fuselage.

In a further aspect, the radome is positioned adjacent to an aircraft fuselage exterior.

In a further aspect, when the thermoelectric cooling assembly is in operation, a temperature differential is established between a temperature of the antennae array and a temperature of the aircraft fuselage exterior, said temperature differential ranging from about 100° F. to about 300° F.

In another aspect, the air duct further includes a plurality of projections, with the plurality of projections each including a projection first end and a projection second end, with the projection second end configured to contact the air duct second side.

In another aspect, the plurality of projections are preferably substantially perpendicular to the air duct second side, with the plurality of projections further configured to extend linearly from the air duct second side, and with the plurality of projections comprising at least one of a plurality of fins, a plurality of pins, and a plurality of plates. As used herein, the term "substantially perpendicular" means establishing an angle of about 90°. Accordingly, the plurality of projections extend from the air duct second side into and toward the air duct interior such that the angle established between each projection and the plane of the air duct second side is about 90°.

According to further present aspects, a method is disclosed for insulating a structure adjacent an aircraft antennae array from heat build-up emanating from the antennae array, with the method including positioning a thermoelectric-cooling assembly between an antennae array and an aircraft fuselage exterior, with the thermoelectric-cooling assembly including a ceramic shield layer, with the ceramic shield layer including a ceramic shield layer first side, and with the ceramic shield layer further including a ceramic shield layer second side. According to a present method, the heat-insulating assembly further includes a thermoelectric generator, with the thermoelectric generator comprising a thermoelectric generator first side and a thermoelectric generator second side, with the thermoelectric generator configured to generate an amount of electricity that is adequate to electrically power at least one electrically-powered blower, with the blower in communication with the thermoelectric generator. The heat-insulating assembly further includes an air duct, with the air duct comprising an air duct first side, with the air duct first side proximate to the ceramic shield layer second side, with the air duct further comprising an air duct second side, and with the air duct second side proximate to the thermoelectric generator first side. The method further includes directing electrical power from the thermoelectric generator to the at least one electrically-powered blower with the at least one electrically-powered blower in communication with the air duct, with the at least one electrically-powered blower further in communication with the thermoelectric generator, with the at least one electrically-powered blower configured to receive a flow of electricity from the thermoelectric generator, and with the at least one electrically-powered blower further configured, in an operable state, to provide an airflow through the air duct. The method further includes initiating the airflow through the air duct, with the airflow through the air duct configured to induce a temperature change that is perceived by the thermoelectric generator, and wherein the thermoelectric generator generates an amount of electricity, with the amount of electricity generated adequate to exclusively power the at least one electrically-driven blower.

In another aspect, the method further comprises providing an antennae array, with the antennae array positioned proximate to the thermoelectric generator second side.

In another aspect, the antennae array comprises a phased array connectivity antennae array.

In a further aspect, the antennae array further comprises supporting electronic units.

In another aspect, the heat-insulating assembly is configured to fixedly attach to an aircraft fuselage exterior to form a heat-insulating assembly/aircraft fuselage exterior interface.

In a further aspect, the method further comprises maintaining the temperature of the heat-insulating assembly/aircraft fuselage exterior interface at a temperature ranging from about −65° F. to about 180° F. when the antennae array, in an antennae array operative state, reaches a temperature ranging from about −65° F. to about 450° F.

In a further aspect, a method for making a thermoelectric cooling assembly for an aircraft antennae array assembly is disclosed, with the method including providing a ceramic shield layer, with the ceramic shield layer comprising a ceramic shield layer first side, and a ceramic shield layer second side, positioning an air duct adjacent the ceramic shield layer, with the air duct disposed longitudinally along the length of the ceramic shield, with the air duct configured to be in contact with the ceramic shield second side, with the air duct comprising an air duct first side and an air duct second side, with the air duct first side configured to adjoin the ceramic shield layer second side, and with the air duct further comprising an air duct inlet and an air duct outlet. The method further includes positioning a thermoelectric generator, with the thermoelectric generator comprising thermoelectric generator first side and a thermoelectric generator second side, with the thermoelectric generator first side configured to adjoin the air duct second side. The method further comprises positioning at least one electrically-powered blower configured to direct an airflow through the air duct, said electrically-powered blower positioned proximate to at least one of the air duct inlet and the air duct outlet, with the at least one electrically-powered blower in communication with the thermoelectric generator, with the at least one electrically-powered blower configured to receive a flow of electricity from the thermoelectric generator said flow of electricity adequate to power the at least one electrically-powered blower, and wherein the ceramic shield layer, the air duct, and the thermoelectric generator are configured in a stacked orientation to form the thermoelectric cooling assembly.

In another aspect, the air duct further comprises a plurality of projections, with the plurality of projections each comprising a projection first end and a projection second end, and with the projection second end configured to contact the air duct second side.

In another aspect, the plurality of projections are substantially perpendicular to the air duct second side, with the plurality of projections further configured to extend linearly from the air duct second side, and with the plurality of projections comprising at least one of one or more fins, one or more pins, one or more groupings of pins, and combinations thereof In a further aspect, the thermoelectric cooling assembly is configured to attach to an adapter plate, with the adapter plate configured to attach to an aircraft fuselage exterior section, with the adapter plate comprising an adapter plate first side and an adapter plate second side, with the adapter plate second side positioned proximate to the ceramic shield layer first side, and with the adapter plate comprising an adapter plate footprint.

In another aspect, the thermoelectric cooling assembly is dimensioned to be housed within a radome, and the thermoelectric cooling assembly is further dimensioned to house an antennae array within the radome, with the antennae array positioned within the radome proximate to the thermoelectric generator second side, with the radome comprising a radome inlet in communication with the air duct inlet, with the radome further comprising a radome outlet in communication with the air duct outlet, and with the radome comprising a radome footprint, with the radome footprint exceeding the adapter plate footprint.

The features, functions and advantages that have been discussed can be achieved independently in various aspects or may be combined in yet other aspects, further details of which can be seen with reference to the following description and the drawings.

BRIEF DESCRIPTION OF THE DRAWINGS

Figure 1:
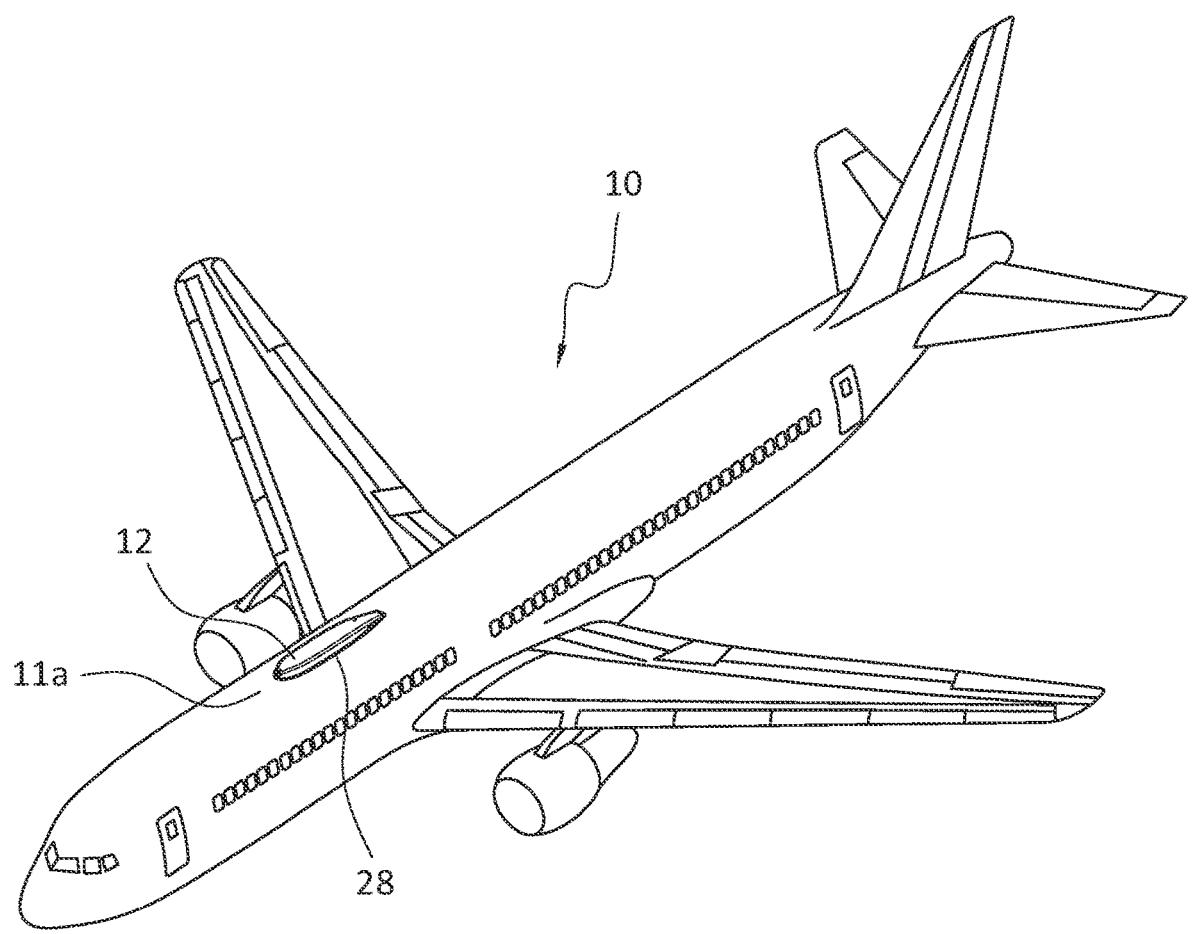
Figure 2:
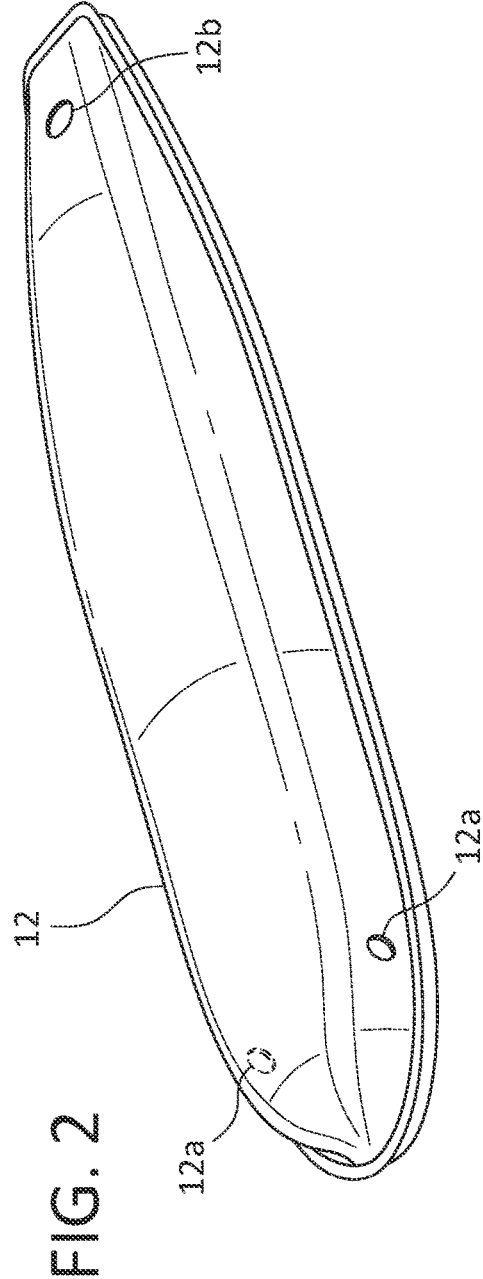
Figure 3A:
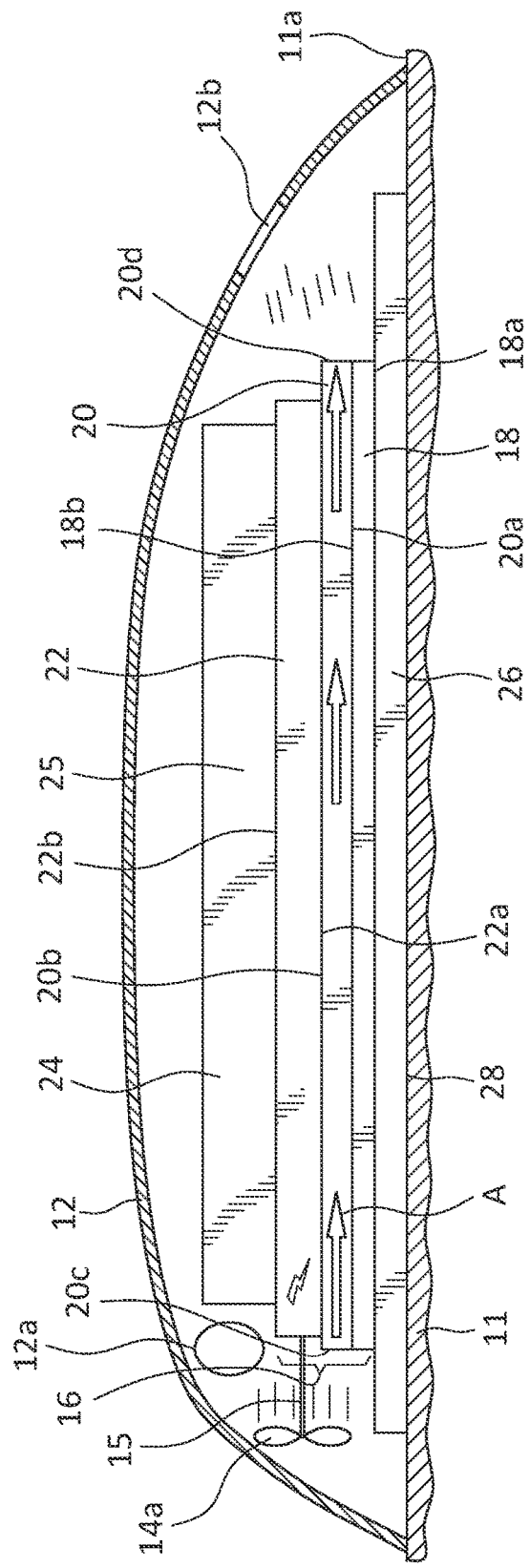
Figure 4:
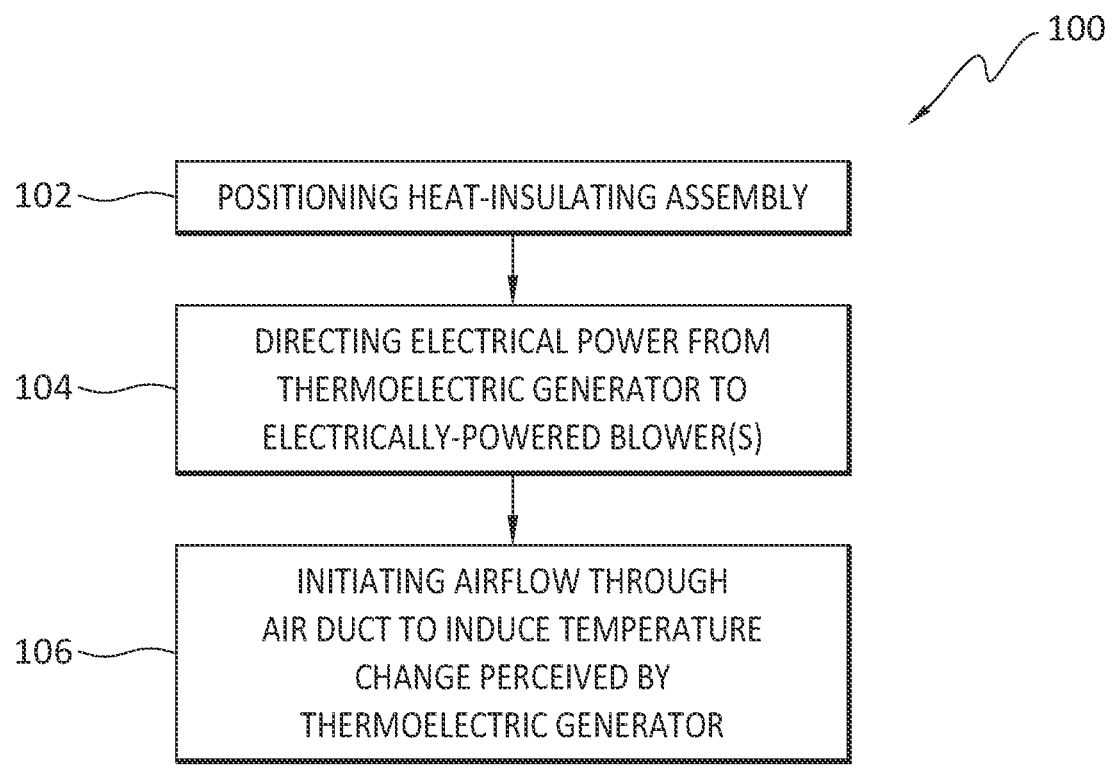
Figure 5:
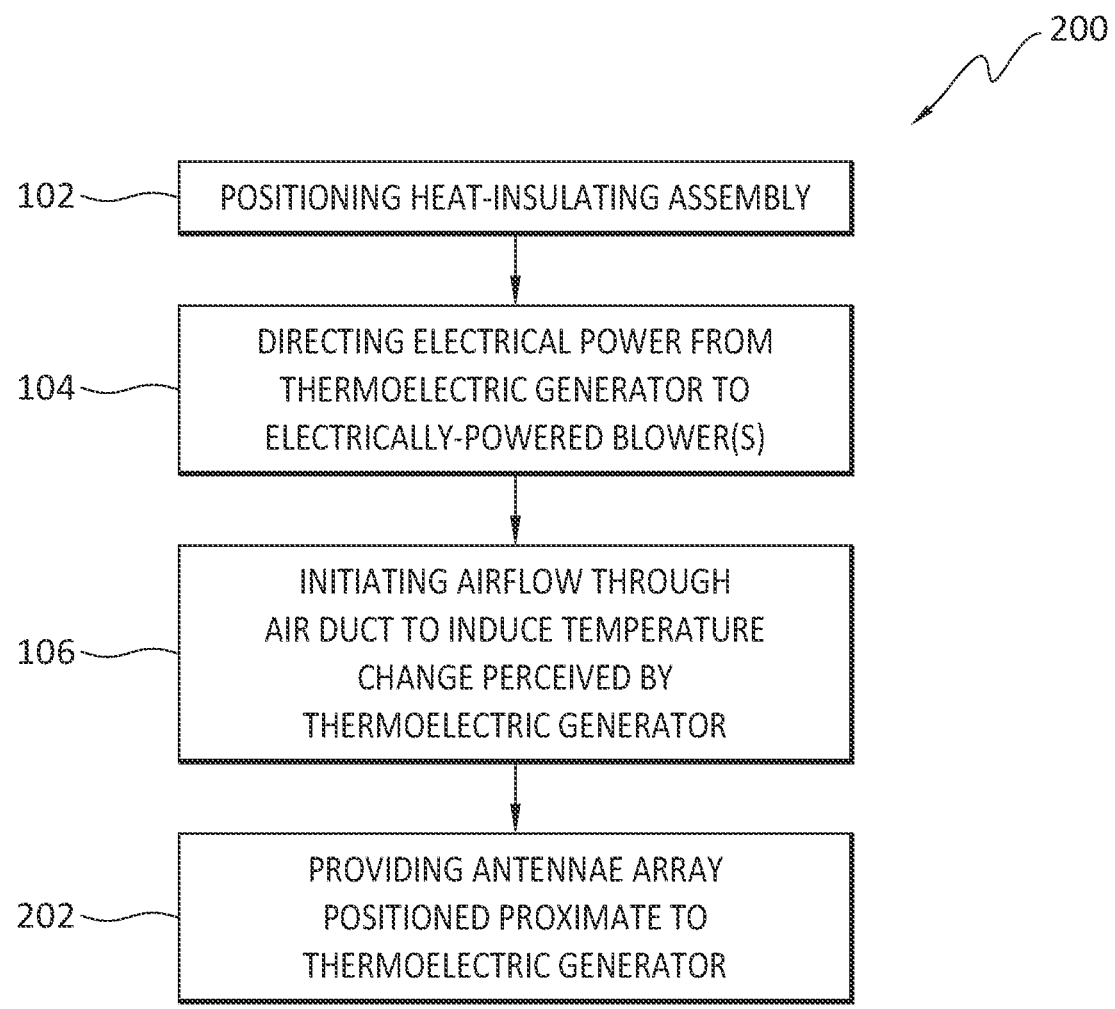
Figure 6:
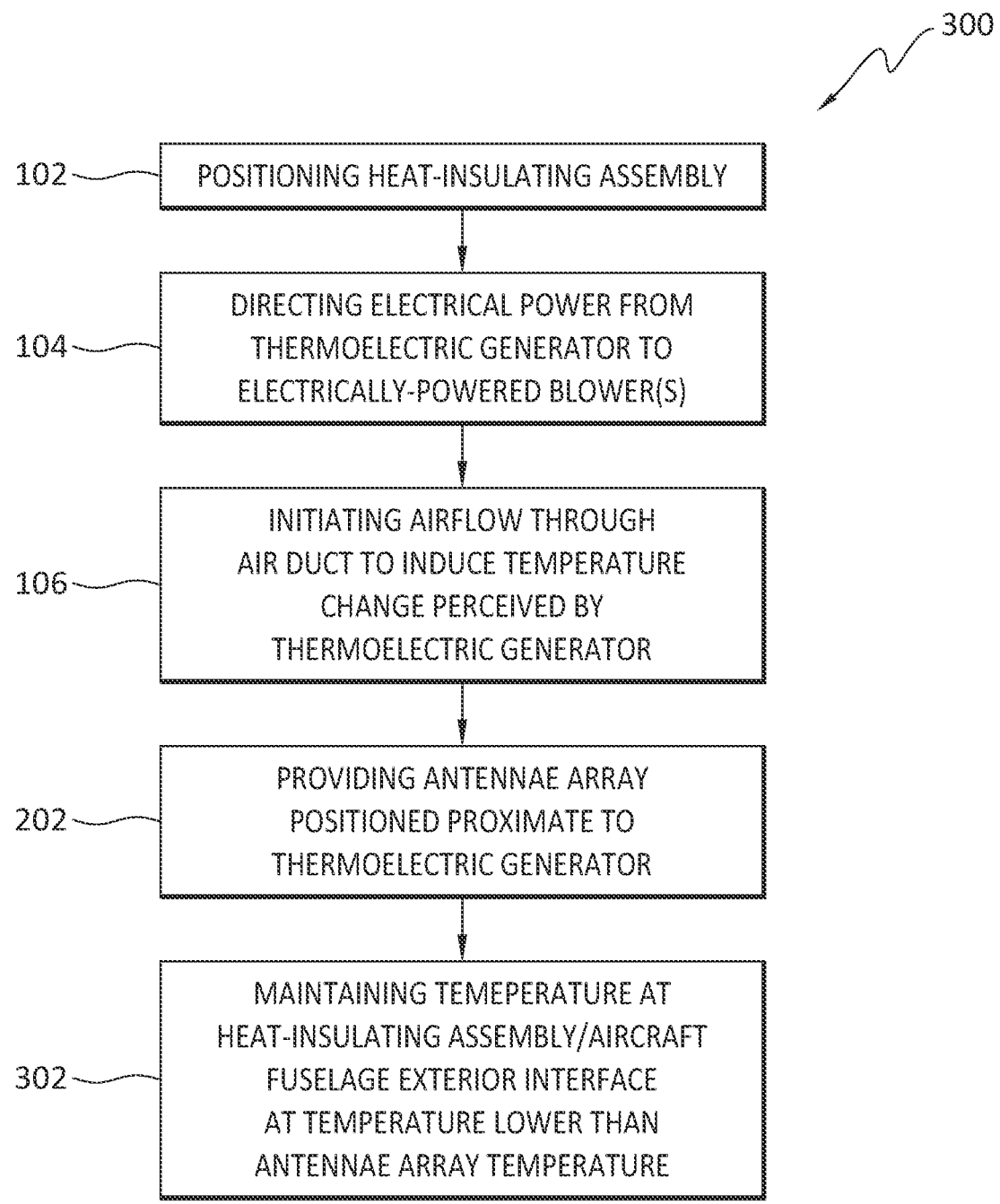

Having thus described variations of the disclosure in general terms, reference will now be made to the accompanying drawings, which are not necessarily drawn to scale, and wherein:

FIG. 1 is an illustration of an aircraft according to present aspects;

FIG. 2 is an elevated view of a radome according to present aspects;

FIG. 3A is a cross-sectional side view of a thermoelectric-cooling assembly within the radome shown in FIG. 2 according to present aspects;

FIG. 3B is an enlarged cross-sectional side view of an alternative air duct within the thermoelectric-cooling assembly shown in FIG. 3A according to present aspects;

FIG. 3C is an enlarged cross-sectional side view of an alternative air duct within the thermoelectric-cooling assembly according to present aspects;

FIG. 4 is a flowchart outlining a method according to present aspects;

FIG. 5 is a flowchart outlining a method according to present aspects;

FIG. 6 is a flowchart outlining a method according to present aspects; and

Figure 7:
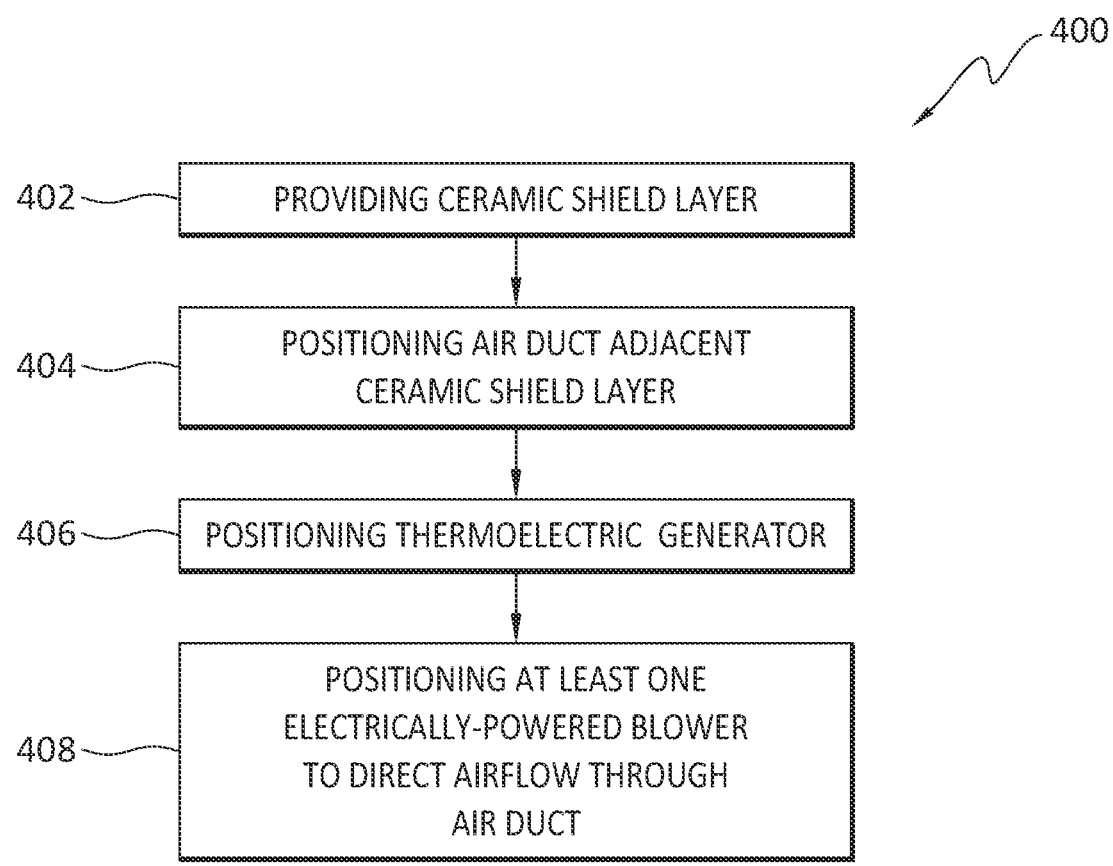

FIG. 7 is a flowchart outlining a method according to present aspects.

DETAILED DESCRIPTION

According to present aspects, methods, systems, and apparatuses are disclosed that redirect, repurpose, recycle, heat (that can be referred to as "waste heat") resulting from the operational use of an antennae array on an aircraft, with the waste heat converted to exclusively generate electrical power required to initiate and operate a cooling system assembly that will reduce the temperature of a structural component that is adjoined, adjacent to, or proximate to an operating antennae array. Disclosed apparatuses, systems, and methods will further provide heat insulation to adjoining, adjacent, or proximate structures to which an antennae array is attached.

Present aspects further disclose a self-powered system and apparatus that is not electrically-parasitic and that does not divert any electricity from an existing onboard power supply or onboard electrical generation system and, instead, itself produces the required electrical energy to necessary to effect a desired temperature reduction of structures and structural components adjoining, adjacent to, or proximate to a high temperature antennae array by scavenging or capturing and recycling resulting heat that can be waste heat from the antennae array to produce a desired amount of electricity that is used to drive the cooling or heat-insulating apparatuses and systems.

Presently disclosed systems, apparatuses, and methods can combine components together in an assembly to obtain the desired heat-insulating effects for materials and structures located adjacent or proximate to a high temperature aircraft antennae array by providing an internal temperature change, or temperature delta between the operational temperature of an aircraft antennae array and the temperature of an area within the thermoelectric cooling assembly and located a distance from the antennae array, with a thermoelectric generator positioned between the antenna array and an air duct.

According to further present aspects, in operation, as the thermoelectric generator perceives a temperature gradient or temperature delta between the two sides of the thermoelectric generator, the thermoelectric generator produces electricity and delivers an electrical current or charge to temperature-changing elements located within or otherwise in communication with the air duct to establish an airflow within the airduct. Presently contemplated temperature-changing elements, according to present aspects, can be electrically-powered blowers (referred to equivalently herein as "blower fans", "blower fan assemblies") that are exclusively powered by electric current provided to the electrically-powered blowers from the thermoelectric generator.

The term "exclusively powered" refers to presently disclosed aspects of satisfying the electrical power requirements of the electrically powered blowers with electrical power supplied to the blowers by the thermoelectric generator, and without the diversion of any electrical power from a power source other than the thermoelectric generator. The systems and apparatuses disclosed herein are termed "self-powered", as the electrical current required to operate the blowers (that initiate and/or maintain airflow in the air duct and create and/or maintain a temperature differential necessary to operate the thermoelectric generator) is directed from the thermoelectric generator directly to the electrically powered blower in the absence of any connection to a further electrical source.

According to present aspects, and as described in further detail and depicted herein, presently disclosed thermoelectric cooling assemblies for aircraft antennae arrays include a thermoelectric generator positioned between a heat generating antennae array and an air duct. The air duct can be further positioned between the thermoelectric generator and a ceramic shield layer. Together, the thermoelectric generator, air duct, and ceramic shield layer are referred to herein as a "thermoelectric cooling assembly". In operation, the thermoelectric cooling assembly maintains a temperature differential between the side of the thermoelectric generator that is positioned adjacent the antennae array and the side of the thermoelectric generator that is positioned adjacent the air duct.

According to present aspects, the ceramic shield layer, that is positioned adjacent the air duct, represents the component of the thermoelectric cooling assembly that is most distant from the antennae array, with the ceramic shield layer exposed, during operation of the thermoelectric cooling assembly, to a temperature that is lower than the temperature of the operational antennae array, and the ceramic shield layer is the component of the thermoelectric cooling assembly that is closest to the structure to which the thermoelectric cooling assembly can be attached such as, for example, an aircraft fuselage exterior. According to present aspects, since the thermoelectric cooling assembly protects the aircraft fuselage exterior from the high temperatures generated by the antennae array, the thermoelectric cooling assembly can also be referred to as a heat-insulating assembly, at least with respect to the aircraft fuselage exterior.

According to present aspects, and as used herein, the term "proximate" refers to the relative positioning to one another of two or more components (e.g., in an assembly, etc.) where the two or more components are positioned next to one another, and can be in intimate contact with one another in an adjacent orientation. In addition, the term "proximate" is meant to also capture the relative positioning to one another of two or more components where a small gap can occur between the components such that the components may not be in intimate contact across the totality of their adjacent lengths or widths, but are still in close proximity to one another.

Further present aspects contemplate housing the antennae array and the thermoelectric cooling assembly within a structure that can be, for example, a radome that can be, for example, an aerodynamic aircraft radome. The radome can further be dimensioned or otherwise have a perimeter footprint to further house an optional adapter plate configured to secure the antenna array and the thermoelectric cooling assembly to the aircraft fuselage exterior. According to present aspects, the radome can have one or more openings serving as one or more radome air inlets that accept entry of an outside airflow into the radome, and radome air outlets that facilitate the passage of an airflow out of the radome. When an adapter plate is used to secure the cooling assembly and antennae array to the aircraft fuselage exterior, according to present aspects, the adapter plate is positioned between the ceramic shield layer of the thermoelectric cooling assembly and the aircraft fuselage exterior.

Non-limiting representative examples of the present aspects are shown in the FIGS. FIG. 1 shows an aircraft 10, with the aircraft 10 including an aircraft fuselage exterior 11a and a radome 12 attached to the aircraft fuselage exterior 11a. FIG. 2 shows an enlarged perspective view of radome 12 that can be of the type shown in FIG. 1, with radome 12 including radome inlet 12a and radome outlets 12b. While FIG. 2 shows radome 12 including one radome inlet 12a and two radome outlets 12b, it is understood that, according to present aspects, any number of radome inlets and radome outlets are contemplated, with the actual number of radome inlets and radome outlets selected being non-limiting.

FIG. 3A is a cross-sectional side view of radome 12 of the type shown in, for example, FIGS. 1 and 2. As shown in FIG. 3A, radome 12 includes radome inlet 12a and radome outlet 12b. FIG. 3A further shows radome 12 in intimate contact with the aircraft fuselage exterior 11a of aircraft fuselage 11. While not shown explicitly in FIG. 3A, radome 12 can be coupled, joined, or fastened to aircraft fuselage 11 by any coupling, joining, and/or fastening means, as desired. As further shown in FIG. 3A, an antennae array 24 that can include antennae array electronic units 25 is positioned on thermoelectric generator 22, with thermoelectric generator 22 including thermoelectric generator first side 22a and thermoelectric generator second side 22b.

The reference to electronic units 25 that can be associated with an antennae array include any electronic units that can be integrated into an antennae array, or that can be in communication with an antennae array, or that can be electronic units within radome 12 capable of generating heat in operation. According to present aspects, the thermoelectric cooling assemblies that dissipate and/or dispel heat generated by the antennae array within radome 12 can also dissipate and/or dispel heat generated by such attending electronic units that may or may not be associated with the antennae array, and that also reside within radome 12.

As shown in FIG. 3A, antennae array 24 is positioned adjacent to thermoelectric generator second side 22b. Although not explicitly shown in FIG. 3A, antennae array 24 can be coupled, joined, or fastened to thermoelectric generator 22 by any coupling, joining and/or fastening means, as desired. If desired, although not shown in FIG. 3A, a small gap can exist between the antennae array 24 and thermoelectric generator 22. Thermoelectric generator 22 is further shown positioned between antenna array 24 and air duct 20, with thermoelectric generator first side 22a positioned adjacent air duct second side 20b. Air duct 20 further is shown including air duct inlet 20c and air duct outlet 20d. Thermoelectric generator 22 can be coupled, joined, or fastened to air duct 20 by any coupling, joining, and/or fastening means, as desired.

As further shown in FIG. 3A, air duct 20 is positioned between thermoelectric generator first side 22a and ceramic shield second side 18b of ceramic shield layer 18, with ceramic shield layer first side 18a positioned adjacent adapter plate 26, such that ceramic shield layer 18 is positioned between air duct 20 and adapter plate 26. Ceramic shield layer 18 can be coupled, joined, or fastened to air duct 20 by any coupling, joining, and/or fastening means, as desired. As shown in FIG. 3A, taken together, the three components: 1) thermoelectric generator; 2) air duct; and 3) ceramic shield layer together comprise the thermoelectric cooling assembly 16.

FIG. 3A further shows electrical connections 15 extending from thermoelectric generator 22 into at least one electrically-powered blower 14a. As shown in FIG. 3A, in operation, when the electrically powered blower 14a receives an electric current delivered from the thermoelectric generator 22, the electrically-powered blower 14a will operate and otherwise be configured to originate (e.g., initiate, etc.) and maintain or alter a desired airflow within the air duct 20, with the airflow moving within air duct 20 in a direction as indicated by arrows "A", with the airflow moving from air duct inlet 20c through air duct 20 and exiting air duct 20 at air duct outlet 20d, and with the airflow further directed and otherwise released from radome 12 via radome outlet 12b. While FIG. 3A shows one blower 14a located proximate to air duct inlet 20c, it is presently contemplated that any number of electrically-powered blowers that can be exclusively powered from the current received from the thermoelectric generator can be employed in the thermoelectric cooling assembly 16. Though not shown in FIG. 3A an electrically-powered blower can be located proximate to air duct outlet 20d. It is presently contemplated that any number of electrically-powered blowers that can be exclusively powered from the current received from the thermoelectric generator can be employed in the thermoelectric cooling assembly 16.

Further, while the electrically-powered blower is stylized in FIG. 3A as having a fan, propeller, turbine, impeller, etc. for generating an airflow in a desired airflow direction, any type of electrically-powered blower capable of generating an airflow in a desired airflow direction is presently contemplated by the aspects presented herein, including electrically-powered blowers that do not include a fan, propeller, turbine, impeller, etc. A present aspect contemplates the incorporation of at least one electrically-powered blower that can produce an airflow ranging for example, from about 2 $ft^3$/min. to about 4 $ft^3$/min. while requiring a relatively low electrical "draw" (e.g., current), with the current required by a presently contemplated electrically-powered blower ranging, for example, from about 0.1 A (ampere or "amp") to about 0.5 A to produce the desired airflow, and also having a minimal start-up electrical energy requirement of ranging, for example, from about 0.1V to about 0.5V.

Without being bound to no particular theory, according to present aspects, thermodynamic features that assist in directional heat distribution, directional heat dispersion, etc., can be employed in the thermoelectric cooling assemblies disclosed herein. For example, materials for the air duct can be selected to maximize heat conductivity away from the thermoelectric generator first side 22a. Air ducts can be made from any metal or metal-containing material, including, for example, aluminum, aluminum alloy, steel, etc., with consideration paid to material density such that lightweight and durable materials are preferred to insure that overall system and assembly weight is kept to a minimum.

Present aspects further contemplate the arrangement of the components of the thermoelectric cooling assembly to be in intimate contact with one another, although, if desired, a small gap between the positioned thermoelectric cooling assembly components can occur, so long as adequate heat dissipation away from the antennae array is accomplished for the thermoelectric generator to function in view of the temperature difference (e.g., thermal change or thermal delta, etc.) perceived by the thermoelectric generator and existing between the temperature of the thermoelectric generator first second side 22b (positioned adjacent the antennae array 24) and the thermoelectric generator second side 22a (positioned adjacent to the air duct 20) such that the thermoelectric generator can generate and deliver the requisite current to drive the at least one electrically-powered blower (e.g., for the purpose of initiating, maintaining, and/or altering a desired airflow through the air duct 20).

Thermodynamic features located within the air duct 20 are shown in FIG. 3B, and are presented as alternative aspects. FIG. 3B is a non-limiting enlarged representative cross-sectional side view of air duct 20, of the type shown, for example, in FIG. 3A, with the addition of projections 30 that can be in the form of, for example, fins, plates, pins, etc. As shown in FIG. 3B, projections 30 are in contact with and/or integral with an internal surface of air duct second side 20b, with the projections extending from the air duct second side 20b into air duct 20 and further extending to a desired distance away from the air duct second side 20b. Projections 30 include a projection second end 30b that is in contact with and/or integral with air duct second side 20b, and projection 30 further includes projection second end 30a. The projections can be spaced along the inside of the air duct second side 20b in any desired orientation, including spaced in groupings as shown, or with each projection spaced from one another, as desired.

In further alternate aspects, the projection can be a single fin or blade or a plurality of fins or blades that can assist in thermodynamic distribution or dispersing of heat away from the air duct second side 20b to further enhance a desired temperature gradient or temperature delta between the higher temperature of the thermoelectric generator second side 22b (adjacent the antennae array 24) and the lower temperature of the thermoelectric generator second side 22a (adjacent the airduct second side 20b), or to increase efficiency of the thermoelectric cooling assembly.

FIG. 3C is a non-limiting enlarged representative cross-sectional side view of air duct 20 of the type shown, for example, in FIG. 3A and/or FIG. 3B, but with the presence of projections that can be in the form of, for example, fins, plates, etc. rather than "pins". As shown in FIG. 3C, projections 32 are in contact with and/or integral with an internal surface of air duct second side 20b, with the projections extending from the air duct second side 20b into air duct 20 and further extending to a desired distance away from the air duct second side 20b. Projections 32 include a projection second end 32b that is in contact with and/or integral with air duct second side 20b, and projection 32 further includes projection second end 32a. The projections 32 preferably can be oriented longitudinally within and along the length of air duct 20. Projections 32 can be spaced along the inside of the air duct 20 and in contact with air duct second side 20b in any desired orientation, including spaced in groupings, or with each projection spaced from one another, as desired.

As presently contemplated, in operation, within the air duct, as an induced airflow is directed in the direction of arrow "A" (e.g., due to of the operation of one or more of the electrically-powered blower 14a, etc.) the projections 30 are impacted by an airflow having a temperature that is less than the temperature of the projections 30 (and less than the temperature of the antennae array, etc.) resulting in projections that are "cooled" by the airflow, and further resulting in additional heat being directed from the projection second end toward the projection first end. This thermodynamic cooling function of the thermoelectric cooling assembly facilitates the further dissipation of heat away from the airduct second side 20b and, in turn, from the thermoelectric generator first side 22a.

The projections can be substantially linear and can be disposed to project away from the air duct second side 20b and extend linearly from the air duct second side 20b toward and into the cavity of the air duct 20 in an orientation that is substantially perpendicular to the plane of the air duct 20 (including the plane of air duct second side 20b).

According to present aspects, the thermoelectric cooling assemblies comprise a thermoelectric generator, also referred to in non-limiting fashion as a Seebeck generator. Such devices are typically solid state devices that internally convert heat flux directly into electrical energy via a thermoelectric effect referred to as the Seebeck Effect, and can function similar to heat engines, but with no moving parts. The thermoelectric generators sense a temperature differential between a "hot side" and a "cool side" that triggers the conversion of the perceived heat change, (also referred to equivalently herein as "heat delta" and/or "heat differential"), into electrical energy generation.

Present aspects contemplate the deployment of thermoelectric generators into the present thermoelectric cooling assemblies for the purpose of converting so-called "waste heat" energy generated by the antennae array into useful electrical energy used to power the electrically-powered blowers and sustain the cooling function of the presently disclosed methods, systems, and apparatuses. The sustained temperature drop achieved, according to present aspects, insures the integrity of the structural components to which the antennae array is attached, as the structural components are not exposed to the high temperatures generated by the antennae array while the antennae array is in operation, including while, for example, an aircraft is on the ground, taxiing, and/or in flight. The protection of the structural components such as, for example, an aircraft fuselage and aircraft fuselage exterior (that can, for example, comprise a composite material or a metal that is not rated for sustained exposure to the high temperatures generated by the antennae array, etc.) can be referred to as "insulating" the structural components from excessive heat. In this way, the thermoelectric cooling assemblies disclosed herein can also be considered to be heat-insulating assemblies with respect to the structural components that are insulated from the excessive heat generated by the antenna arrays.

According to present aspects, the thermoelectric cooling assemblies can be coupled to the antennae array using, for example, any acceptable mechanical fasteners, bolting assemblies, etc. for the purpose of maintaining the thermoelectric cooling assembly in intimate contact with the antennae array. The antenna array and the electrical units associated with the antennae array can be a phased array connectivity antennae array of the type that can, in an operable state, generate temperatures ranging from about 390° F. to about 450° F. Without the incorporation of the presently disclosed thermoelectric cooling assemblies into the antennae radome, such temperatures generated by the antennae array could have detrimental effects on the structural components at or near the areas of attachment of the antennae radome to the structural component supporting the antennae radome.

According to present aspects, the thermoelectric cooling assemblies attached to the antennae array achieve a temperature differential across the thermoelectric generator to enable the thermoelectric generator to deliver the totality of the electrical current required to power the electrically-powered blowers, thus enabling an overall temperature differential between the antennae array temperature and the temperature of the adjacent aircraft fuselage exterior, with the temperature differential ranging from about 100° F. to about 300° F. That is, according to one present example, in an operable state, when a phased array connectivity antennae array generates heat at a temperature ranging from about 390° F. to about 450° F., the presently disclosed thermoelectric cooling assemblies maintain a measured temperature at the radome/aircraft fuselage exterior interface ranging from about 120° F. to about 180° F. According to further present aspects, the temperature differential achieved according to present methods, systems, and apparatuses insures that the temperature at the radome/aircraft fuselage exterior interface does not exceed a temperature for which the structural component is rated; for example, with the temperature not exceeding a temperature of about 180° F.

During flight, when an aircraft incorporates the thermoelectric cooling assembly and the antennae array disclosed herein, according to present aspects, it is contemplated that the ceramic shield first side temperature (the side of the ceramic shield layer adjacent a structure component or an adapter plate configured to attach the thermoelectric cooling assembly and antennae array in the radome to a structural component) will not exceed a temperature ranging from about −65° F. to about 180° F., even when the antennae array reaches a temperature ranging from about −65° F. to about 450° F. In other words, when the systems, apparatuses, and methods of the present disclosure are in an operable state, and the antennae array reaches a temperature of 450° F., according to present aspects, the ceramic shield layer insulates the structural component to which the antennae array radome is attached such that the ceramic layer first side (and the component structure surface, e.g., at the radome/aircraft fuselage exterior interface) will not exceed a temperature of about 180° F.

According to further present aspects, the thermoelectric cooling assembly comprises a ceramic shield layer positioned adjacent the air duct first side 20a. The ceramic shield layer can comprise any useful ceramic material possessing thermal insulation and radiative cooling characteristics that will further insulate a structural component (e.g., an aircraft fuselage exterior, etc.) positioned adjacent the antenna radome from the excessively higher temperatures emanating from the operational antennae array. Preferred ceramic shield layers can comprise, for example, aluminum oxide, silicon nitride, cordierite, millerite, etc. According to present aspects, the ceramic shield layer can be configured to act as a "fail safe" in the event the electrically-powered blowers fail. Present aspects contemplate the majority of the thermoelectric cooling effect obtained by the thermoelectric cooling assembly, and the significant majority of heat dissipation, residing in the generation of the airflow through the air duct, rather than relying on the ceramic shield to solely insulate the structural component (e.g., an aircraft fuselage exterior, etc.) from exposure to the excessive heat generated by the antennae array.

As shown in FIG. 3A, an adapter plate 28 is shown that can be configured to secure the thermoelectric cooling assembly to a final desired position on a structural component (with the structural component shown in FIG. 3A to be an aircraft fuselage exterior 11a of an aircraft fuselage 11). Present aspects further contemplate the adapter plate being made from any suitable material, with material selection taking into consideration strength-to-weight ratios, etc., with the adapter plate made from a material including a metal, a composite material, and combinations thereof.

In one aspect, the footprint of the adapter plate perimeter can, for example, exceed the footprint of the antennae array and/or also exceed the thermoelectric cooling assembly footprint by any desired area, with the understanding that, according to present aspects, the adapter plate dimension (e.g., footprint) is selected to fit within the dimension (e.g., footprint perimeter) of the radome, such that aerodynamic effect in minimizing, for example, drag, turbulence, etc., is maximized (e.g., for an aircraft during flight, etc.). According to a present aspect, the adapter plate footprint is 2× to 3× greater than the antennae array footprint.

The radome component disclosed herein can incorporate any suitable radome design that can be configured to house both the antennae array, the thermoelectric cooling assembly, and optionally an adapter plate, as disclosed herein. As shown at least in FIGS. 2, 3A, 3B 3C, the presently contemplated radome is configured to assist in the initiation of the cooling function of the thermoelectric cooling assembly in view of the radome comprising both at least one radome air inlet preferably positioned proximate to or otherwise in communication with, and preferably upstream of, the air duct inlet, and at least one radome air outlet that can be preferably positioned downstream of the air duct outlet. Present aspects contemplate that the radome outer mold line (OML), and the radome overall dimension, and the positioning of at least one radome inlet and at least one radome outlet on the radome can be selected to most advantageously maximize aerodynamic airflow over an aircraft during flight. Further, the presently contemplated radomes can be dimensioned and otherwise comprise air inlet and air outlet airflow features that will minimize drag and/or air turbulence, eddy creation, etc.

Present aspects further disclose a method for insulating a structure positioned adjacent an aircraft antennae array, and insulating the structure from heat build-up emanating from the antennae array. FIGS. 4, 5, 6, and 7 are flowcharts outlining methods according to present aspects. As shown in FIG. 4, according to a present aspect a method 100 includes positioning 102 a thermoelectric-cooling assembly between an antennae array (that can be, for example, a phased array connectivity antennae array, etc., and that can comprise attending electronic units) and an aircraft fuselage exterior section, with the thermoelectric-cooling assembly including a ceramic shield layer, with the ceramic shield layer including a ceramic shield layer first side, and with the ceramic shield layer further including a ceramic shield layer second side. According to a present method, the heat-insulating assembly further includes a thermoelectric generator, with the thermoelectric generator comprising a thermoelectric generator first side and a thermoelectric generator second side, with the thermoelectric generator configured to generate an amount of electricity that is adequate to electrically power at least one electrically-powered blower. The heat-insulating assembly further includes an air duct, with the air duct comprising an air duct first side, with the air duct first side proximate to the ceramic shield layer second side, with the air duct further comprising an air duct second side, and with the air duct second side proximate to the thermoelectric generator first side. The method 100 further includes directing 104 electrical power from the thermoelectric generator to the at least one electrically-powered blower with the at least one electrically-powered blower in communication with the air duct, with the at least one electrically-powered blower further in communication with the thermoelectric generator, with the at least one electrically-powered blower configured to receive a flow of electricity from the thermoelectric generator, and with the at least one electrically-powered blower further configured, in an operable state, to provide an airflow through the air duct. The method 100 further includes initiating 106 the airflow through the air duct, with the airflow through the air duct configured to induce a temperature change that is perceived by the thermoelectric generator, and wherein the thermoelectric generator generates an amount of electricity, with the amount of electricity generated adequate to exclusively power the at least one electrically-driven blower. The method 100 contemplates the use of described components at least as shown in one or more of FIGS. 1, 2, and 3.

FIG. 5 is a flowchart outlining a present method 200 according to present aspects that includes the steps associated with method 100 shown in FIG. 4, and further including 202 providing an antennae array, with the antennae array positioned proximate to the thermoelectric generator second side. The method 200 contemplates the use of described components at least as shown in one or more of FIGS. 1, 2, 3, and 4.

In another aspect, the heat-insulating assembly is configured to fixedly attach to an aircraft fuselage exterior to form a heat-insulating assembly/aircraft fuselage exterior section interface.

FIG. 6 is a flowchart outlining a further aspect. According to present aspects, FIG. 6 outlines a method 300 that includes the steps associated with method 100 shown in FIG. 4 and method 200 shown in FIG. 5, and further includes maintaining 302 the temperature of the heat-insulating assembly/aircraft fuselage exterior interface at a temperature ranging from about −65° F. to about 180° F. when the antennae array, in an antennae array operative state, reaches a temperature ranging from about −65° F. to about 450° F. The method 300 contemplates the use of described components at least as shown or described in one or more of FIGS. 1, 2, 3, 4 and 5.

FIG. 7 is a flowchart outlining a further aspect. FIG. 7 shows a method 400, according to present aspects, for making a thermoelectric cooling assembly for an aircraft antennae array assembly. Method 400 includes providing 402 a ceramic shield layer, with the ceramic shield layer comprising a ceramic shield layer first side, and a ceramic shield layer second side. Method 400 further includes positioning 404 an air duct adjacent the ceramic shield layer, with the air duct disposed longitudinally along the length of the ceramic shield, with the air duct configured to be in contact with the ceramic shield second side, with the air duct comprising an air duct first side and an air duct second side, with the air duct first side configured to adjoin the ceramic shield layer second side, and with the air duct further comprising an air duct inlet and an air duct outlet. The method 400 further includes 406 positioning a thermoelectric generator, with the thermoelectric generator comprising thermoelectric generator first side and a thermoelectric generator second side, with the thermoelectric generator first side configured to adjoin the air duct second side. The method 400 further comprises positioning 408 at least one electrically-powered blower configured to direct an airflow through the air duct, said electrically-powered blower positioned proximate to at least one of the air duct inlet and the air duct outlet, with the at least one electrically-powered blower in communication with the thermoelectric generator, with the at least one electrically-powered blower configured to receive a flow of electricity from the thermoelectric generator said flow of electricity adequate to power the at least one electrically-powered blower, and wherein the ceramic shield layer, the air duct, and the thermoelectric generator are configured in a stacked orientation to form the thermoelectric cooling assembly.

In another aspect, the air duct further comprises a plurality of projections, with the plurality of projections each comprising a projection first end and a projection second end, and with the projection second end configured to contact the air duct second side.

In another aspect, the plurality of projections are substantially perpendicular to the air duct second side, with the plurality of projections further configured to extend linearly from the air duct second side, and with the plurality of projections comprising at least one of a plurality of fins and a plurality of pins.

In a further aspect, the thermoelectric cooling assembly is configured to attach to an adapter plate, with the adapter plate configured to attach to an aircraft fuselage exterior section, with the adapter plate comprising an adapter plate first side and an adapter plate second side, with the adapter plate second side positioned proximate to the ceramic shield layer first side, and with the adapter plate comprising an adapter plate footprint.

In another aspect, the thermoelectric cooling assembly is dimensioned to be housed within a radome, and the thermoelectric cooling assembly is further dimensioned to house an antennae array within the radome, with the antennae array positioned within the radome proximate to the thermoelectric generator second side, with the radome comprising a radome inlet in communication with the air duct inlet, with the radome further comprising a radome outlet in communication with the air duct outlet, and with the radome comprising a radome footprint, with the radome footprint exceeding the adapter plate footprint. The method 400 contemplates the use of described components at least as shown or described in one or more of FIGS. 1, 2, 3, 4, 5, and 6.

the thermoelectric cooling assembly systems, apparatuses, and methods disclosed herein, according to present aspects provide at least the advantages of protecting a structural component positioned adjacent to an antennae array from excessive temperatures produced by the antennae array by providing a self-powered and self-regulated thermoelectric cooling assembly that can be exclusively powered by the use of waste heat emanating from the antennae array. Further, according to present aspects, the presently disclosed systems, apparatuses and methods disclose a thermoelectric cooling assembly that obviates the need for monitoring systems, sensors, control systems, software, wiring (e.g., to an on-board aircraft power supply, etc.), with the presently disclosed systems, apparatuses and methods having the added benefits of eliminating aircraft component weight and system complexity by obviating such monitoring, sensors, control systems, software, and wiring systems, etc.

The present aspects may, of course, be carried out in other ways than those specifically set forth herein without departing from essential characteristics of the disclosure. The present aspects are to be considered in all respects as illustrative and not restrictive, and all changes coming within the meaning and equivalency range of the appended claims are intended to be embraced therein.

What is claimed is:

1. A thermoelectric cooling assembly for an antennae array for use on an aircraft fuselage exterior housed within a radome, the thermoelectric cooling assembly comprising:
   a ceramic shield layer, said ceramic shield layer comprising a ceramic shield layer first side, said ceramic shield layer further comprising a ceramic shield layer second side, said ceramic shield layer first side positioned adjacent an adapter plate, said adapter plate positioned between the ceramic shield layer and the aircraft fuselage exterior, said adapter plate configured to attach the thermoelectric cooling device to the aircraft fuselage exterior at a position within a radome, said radome configured to house an antennae array, said radome having a radome inlet and a radome outlet:
   a thermoelectric generator, said thermoelectric generator comprising a thermoelectric generator first side, said thermoelectric generator further comprising a thermoelectric generator second side;
   an air duct, said air duct comprising an air duct first side, said air duct first side proximate to the ceramic shield layer second side, said air duct further comprising an air duct second side, said air duct second side proximate to the thermoelectric generator first side, said air duct further comprising an air duct inlet and an air duct outlet, said air duct outlet in communication with the radome outlet;
   at least one electrically-powered blower, said electrically-powered blower oriented proximate to at least one of the air duct inlet and the air duct outlet, said at least one electrically-powered blower configured to provide an airflow through the air duct, said at least one electrically-powered blower in communication with the thermoelectric generator; and
   wherein the thermoelectric cooling assembly is housed within the radome;
   wherein the at least one electrically-powered blower is positioned proximate to at least one of the radome inlet and the radome outlet; and
   wherein said air duct is configured to receive an airflow into the air duct at the air duct inlet, said air duct configured to direct the airflow from the air duct inlet to the air duct outlet, said air duct inlet located proximate to the radome inlet, said air duct outlet located proximate to the radome outlet.

2. The thermoelectric cooling assembly of claim 1, further comprising said antennae array, said antennae array positioned proximate to the thermoelectric generator second side.

3. The thermoelectric cooling assembly of claim 2, wherein the antennae array comprises a phased array connectivity antennae array.

4. The thermoelectric cooling assembly of claim 2, wherein the antennae array further comprises heat-generating electronic units.

5. The thermoelectric cooling assembly of claim 1, wherein, the ceramic shield layer first side is configured to maintain a temperature ranging from about −65° F. to about 180° F. when the antennae array reaches a temperature ranging from about −65° F. to about 450° F.

6. The thermoelectric cooling assembly of claim 2, wherein said thermoelectric generator is configured to convert an amount of heat generated by an antennae array into an amount of electricity, said amount of electricity adequate to exclusively power the at least one electrically-powered blower.

7. An object comprising the thermoelectric cooling assembly of claim 1.

8. An aircraft comprising the thermoelectric cooling assembly of claim 1.

9. The thermoelectric cooling assembly of claim 1, wherein the air duct first side is proximate to the ceramic shield layer second side, said air duct further comprising said air duct second side, said air duct second side is proximate to the thermoelectric generator first side.

10. The aircraft of claim 8, wherein the radome is further configured to attach to the aircraft fuselage exterior.

11. The thermoelectric cooling assembly of claim 10, wherein, in operation, a temperature differential is established between a temperature of the antennae array and a temperature of the aircraft fuselage exterior, said temperature differential ranging from about 100° F. to about 300° F.

12. The thermoelectric cooling assembly of claim 1, wherein said air duct further comprises a plurality of projections, said plurality of projections each comprising a projection first end and a projection second end, said projection second end configured to contact the air duct second side.

13. The thermoelectric cooling assembly of claim 1, wherein said plurality of projections are substantially perpendicular to the air duct second side, said plurality of projections further configured to extend linearly from the air duct second side, said plurality of projections comprising at least one of a plurality of fins and a plurality of pins.

14. The thermoelectric cooling assembly of claim 1, wherein the electrically-powered blower is configured to require a low current electrical draw from about 0.1 A to about 0.5 A to produce a selected airflow.

15. The thermoelectric cooling assembly of claim 1, wherein the electrically-powered blower is configured to deliver an airflow through the air duct at a velocity ranging from about 2 ft$^3$/min to about 4 ft$^3$/min at an electrical draw ranging from about 0.1 A to about 0.5 A.

16. The thermoelectric cooling assembly of claim 1, wherein the thermoelectric generator is configured to produce a start-up electrical energy requirement for the electrically-powered blower, said start-up electrical energy requirement ranging from about 0.1V to about 0.5V.

17. The thermoelectric cooling assembly of claim 12, said plurality of projections further comprising at least one of a plurality of fins, a plurality of pins, and a plurality of plates.

18. The thermoelectric cooling assembly of claim 17, wherein said plurality of projections are integral with said air duct second side.

19. The thermoelectric cooling assembly of claim 1, wherein the air duct comprises a metal-containing material.

20. The thermodynamic cooling assembly of claim 19, wherein the metal-containing material comprises at least one of aluminum, aluminum alloy, and steel.